United States Patent [19]
Heung

[11] Patent Number: 5,191,230
[45] Date of Patent: * Mar. 2, 1993

[54] CIRCUIT MODULE FAN ASSEMBLY

[76] Inventor: Lap-Yan Heung, 12565 Crenshaw Blvd., Hawthorne, Calif. 90250

[ * ] Notice: The portion of the term of this patent subsequent to Jan. 7, 2009 has been disclaimed.

[21] Appl. No.: 771,154

[22] Filed: Oct. 3, 1991

Related U.S. Application Data

[63] Continuation of Ser. No. 303,642, Jan. 30, 1989, Pat. No. 5,079,438.

[51] Int. Cl.$^5$ ............................................. H05K 7/20
[52] U.S. Cl. .................................. 307/141; 361/383; 361/384; 361/23
[58] Field of Search ............... 307/141, 149, 150, 112; 361/379-415, 23-33; 318/430-434, 254

[56] References Cited

U.S. PATENT DOCUMENTS

| | | | |
|---|---|---|---|
| 3,332,007 | 7/1967 | Livengood et al. | 323/9 |
| 4,122,508 | 10/1978 | Rumbaugh | 361/384 |
| 4,277,816 | 7/1981 | Dunn et al. | 361/384 |
| 4,296,455 | 10/1981 | Leaycraft et al. | 361/383 |
| 4,354,214 | 10/1982 | Walton | 361/23 |
| 4,356,531 | 10/1982 | Marino et al. | 361/384 |
| 4,401,351 | 8/1983 | Record | 361/395 X |
| 4,513,812 | 4/1985 | Papst et al. | 361/384 X |
| 4,668,898 | 5/1987 | Harms et al. | 318/254 |
| 4,733,115 | 3/1988 | Barone et al. | 361/400 X |
| 4,739,445 | 4/1988 | Tragen | 361/384 |
| 4,751,872 | 6/1988 | Lawson, Jr. | 361/384 X |
| 4,756,473 | 7/1988 | Takemae et al. | 361/384 X |
| 4,758,924 | 7/1988 | Dillon et al. | 361/384 X |
| 4,767,262 | 8/1988 | Simon | 361/384 X |
| 4,774,631 | 9/1988 | Okuyama et al. | 361/384 |
| 4,797,783 | 1/1989 | Kohmoto et al. | 361/384 |

*Primary Examiner*—Paul Ip
*Attorney, Agent, or Firm*—Sheldon & Mak

[57] ABSTRACT

An electronic circuit module fan assembly is disclosed including a circuit module housing, circuit modules, and a fan module. The fan module has a fan unit for cooling the circuit modules. The fan module can be mounted in the housing interchangeably with the circuit modules. The fan module has time delay circuitry for delaying the time when the fan module is powered up until after the initial power surge of the electronic system. The fan module also has noise filter circuitry. A fan module is disclosed wherein the fan unit is slidably attached to the fan module to allow the fan to be placed in different positions for cooling purposes. The fan module can be constructed so that the fan unit is interchangeable with a panel having circuitry.

20 Claims, 2 Drawing Sheets

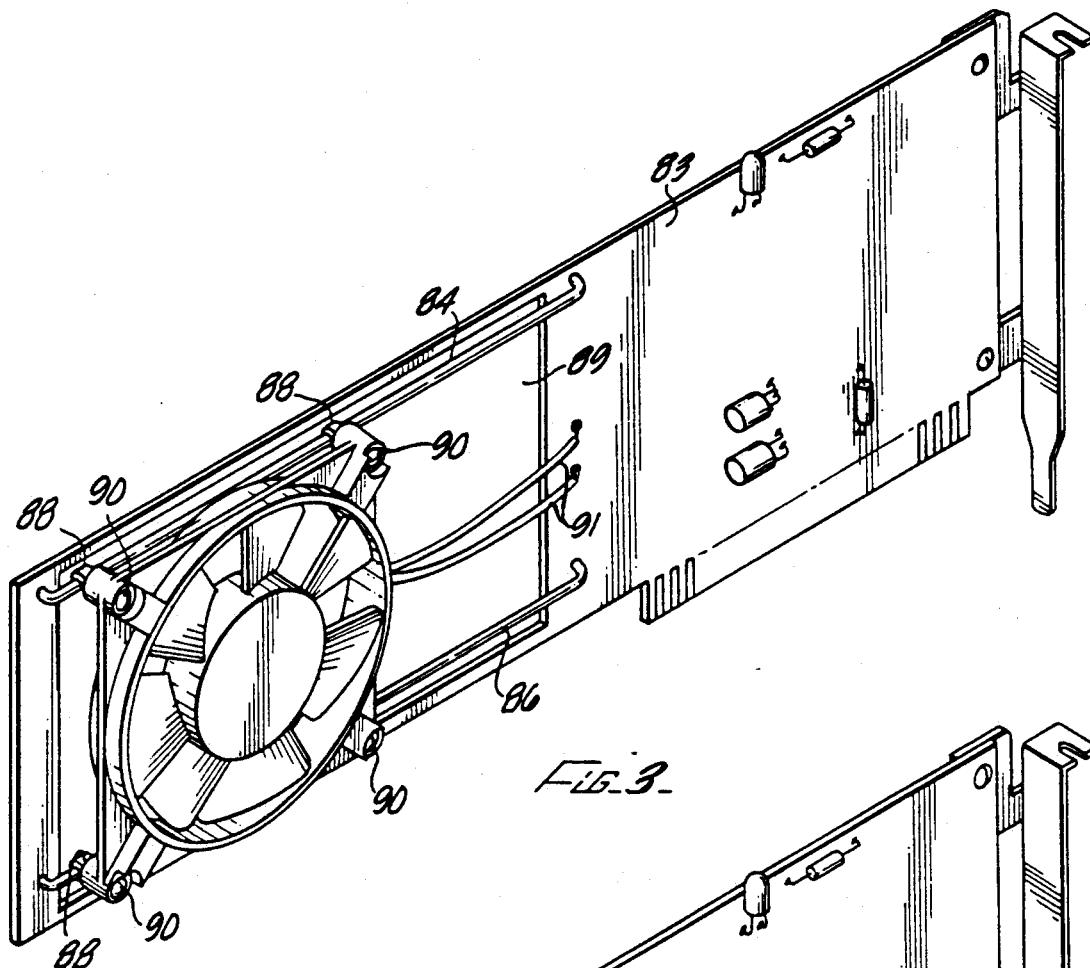
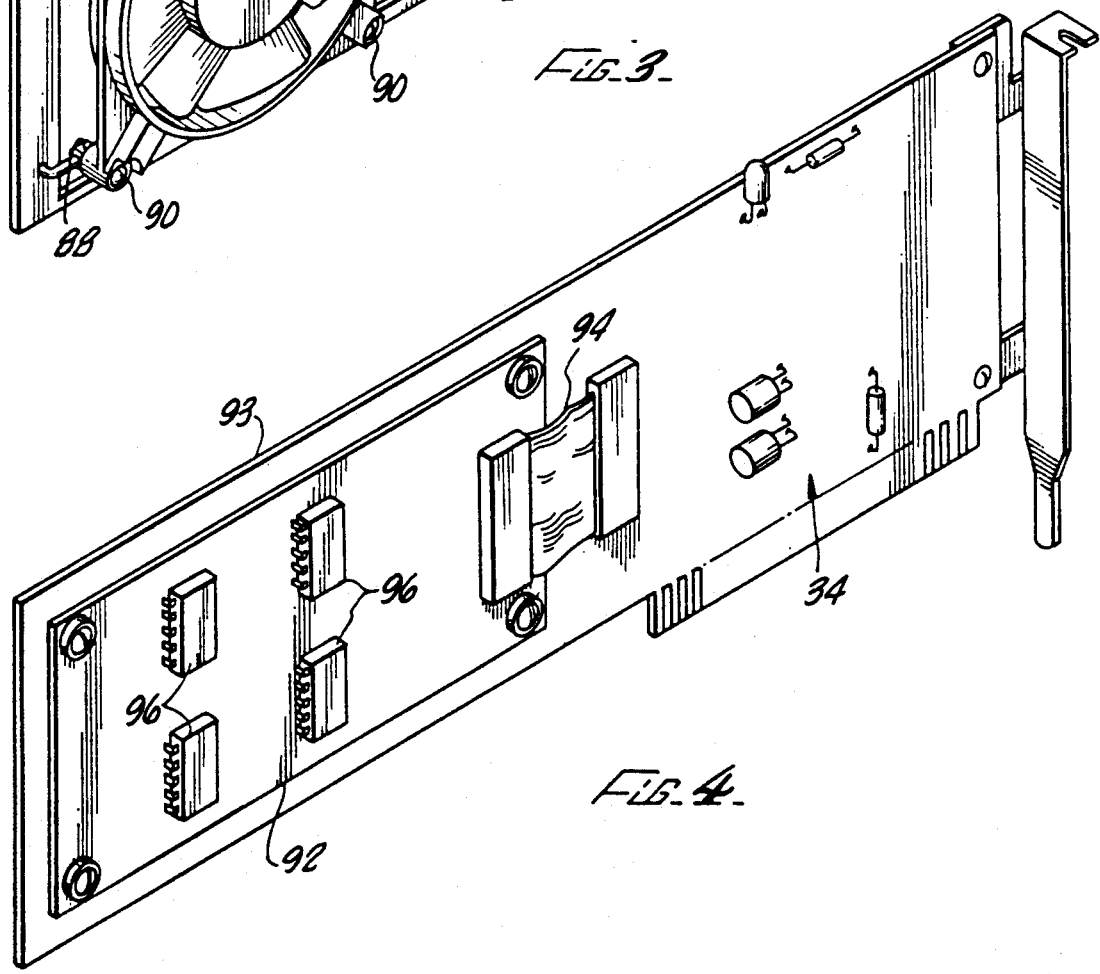

CIRCUIT MODULE FAN ASSEMBLY

This is a continuation of the application Ser. No. 303,642 filed Jan. 30, 1989, U.S. Pat. No. 5,079,438.

BACKGROUND

The field of the present invention is air cooling systems within electronic systems. More particularly, the present invention relates to a fan assembly for use in an electronic system with circuit modules.

Electronic systems, such as computers, employing modular construction are common. A typical electronic system includes a plurality of circuit modules mounted within a housing. The circuit modules can be easily inserted or removed for replacement or repair. The modular construction contributes to the compactness of the electronic system.

A plurality of modular integrated circuits or chips are typically mounted on each circuit module of current electronic systems. As large scale integration technology has improved, the circuitry per unit area within a modular integrated circuit has increased dramatically. The number of modular integrated circuits which can be packed on a circuit module has also increased. Unfortunately, this increase in the compactness of electronic circuitry has also resulted in an increase in the heat generated per unit area of the circuitry. Therefore, overheating of the numerous chips on circuit modules has presented a serious problem.

To overcome this problem, most electronic systems employ the use of air cooling systems in conjunction with heat sink devices. Typically, air flow from a fan is directed past heat sink devices which are thermally connected to the circuitry on the circuit boards. An example of such a device is illustrated in U.S. Pat. No. 4,122,508 to Rumbaugh. In the modular circuit board assembly disclosed in U.S. Pat. No. 4,122,508, a blower 30 is located in a side panel of the housing 11. The air flow from the blower 30 is directed past heat sinks 19 which are thermally connected to circuit boards 16.

The fan in current electronic systems is usually remote from most of the circuit modules within the electronic system housing. The modular integrated circuits on the circuit modules most remote from the fan receive the least amount of cooling effect because the cooling air absorbs heat as it passes the circuit modules in closer proximity to the fan. In many electronic systems, this problem is exacerbated because the circuit modules which generate the most heat are often required by the physical constraints of the electronic system to be located most remote from the fan. As a result, heat sinks are used to dissipate heat from the integrated circuits more rapidly than would otherwise be possible. However, heat sinks decrease the compactness of the electronic system and increase the cost and complexity of manufacturing the electronic system.

An additional problem arises from the remoteness of the fan from many of the circuit modules within the electronic system. Due to the nature of some system housings, the circuit modules themselves often block the cooling air flow of the fan from reaching the other circuit modules.

A further problem is that modular electronic systems typically have special compartments within the electronic system for housing the fan, thus contributing to expense in the manufacture of the electronic system. A further problem resulting from such compartments is usage of the limited available space within most electronic systems. The special construction of fan compartments further increases the difficulty of removing the fan for maintenance or replacement.

SUMMARY

The present invention solves the foregoing problems. The present invention is an electronic circuit module fan assembly for an electronic system which provides more direct air turbulence on the circuit modules thereby dissipating heat more rapidly and reducing the need for heat sinks. The present invention also provides a more compact, a less complex, and a lower cost cooling system.

The electronic circuit module fan assembly of the present invention comprises at least one circuit module and a fan module within an electronic system. The assembly can also include a circuit module housing. The circuit module housing has receiving means for receivably mounting circuit boards. The circuit module has circuitry and is mounted on the receiving means of the housing.

The fan module has a mounting structure which can be a base board, a mounting means for mounting the fan module in the electronic system, at least one electric fan unit, and a driving circuit which is electrically connected to the fan unit. The mounting means is for mounting the fan module in the electronic system interchangeably with the circuit modules. The electric fan unit is mounted to the mounting structure so that there is space between the fan unit and the circuit modules to be cooled when the fan module is installed in the electronic system. The driving circuit is for selectively activating the fan unit. The fan unit creates air turbulence near the circuit module to cool the circuitry of the circuit module when the driving circuit is activated.

The driving circuit can receive power from the same power source as the circuit board and can have a time delay means for delaying the time when the fan unit is activated after the electronic system is powered on. The driving circuit can further include a noise filter for filtering power transients. The fan module can have a mechanical switch for manually selectively activating the fan unit.

The present invention can also include a light-indicator device for indicating that the electronic system power is on. The fan module of the present invention can further be constructed so that the fan unit is removable and replaceable with modular integrated circuitry.

The present invention also includes a fan module for an electronic system. The fan module has essentially the same features as the fan module of the electronic circuit module fan assembly set forth above.

DRAWINGS

These and other features, aspects, and advantages of the present invention will become better understood with reference to the following description, appended claims, and accompanying drawings where:

FIG. 3 is a front elevation view of a fan module according to a second embodiment of the present invention; and FIG. 4 is a front elevation view of a fan module wherein the fan unit is removed and replaced with a panel having circuitry.

DESCRIPTION

Figure 1:
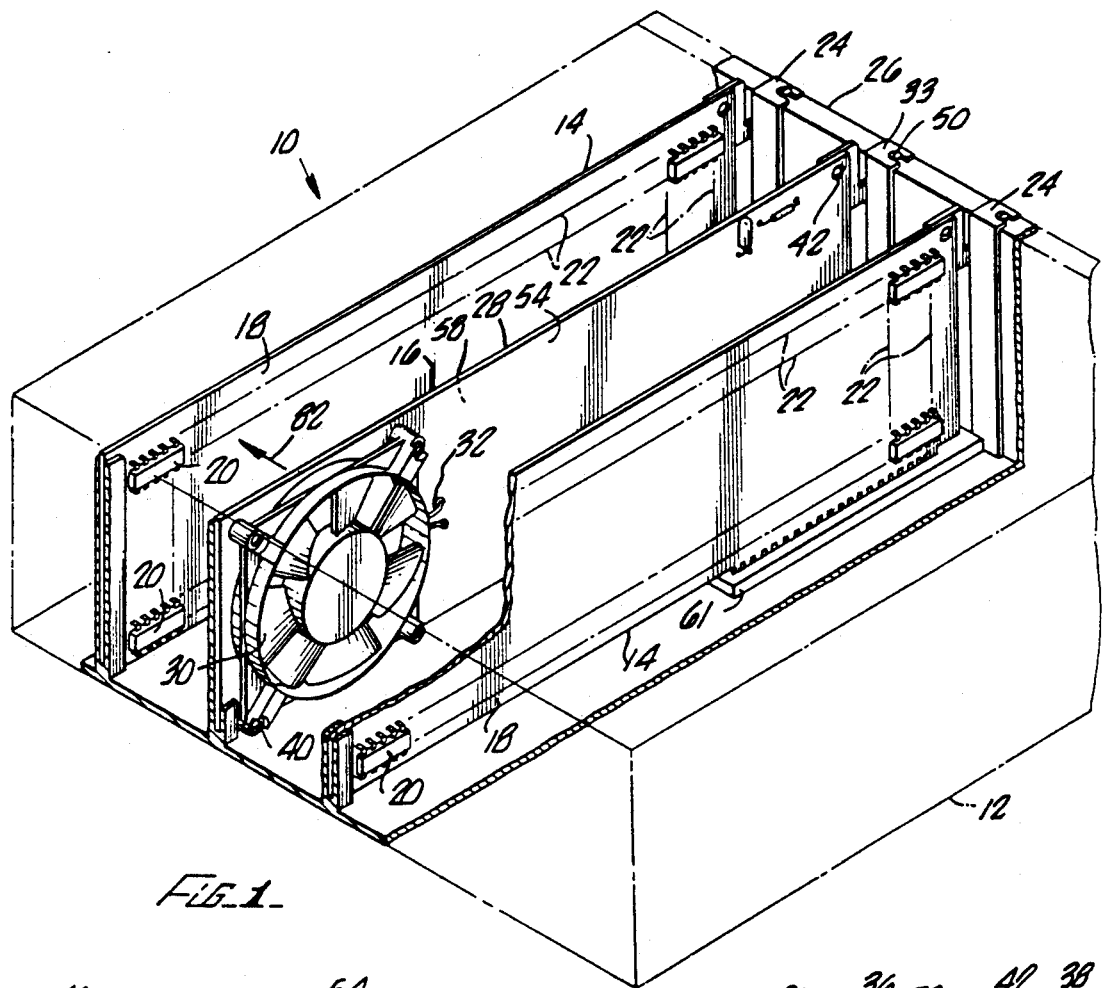
FIG. 1 is a perspective view of an electronic circuit module fan assembly of the present invention.
Figure 2:
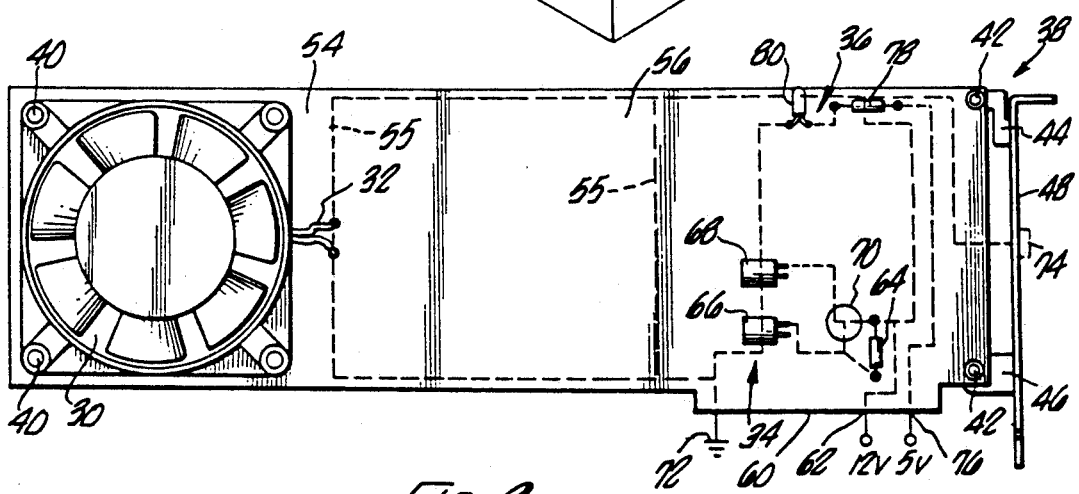
FIG. 2 is a front elevation view of a fan module according to the present invention.

Referring to FIGS. 1 and 2, an electronic circuit module fan assembly 10 comprises a circuit module housing 12, circuit modules 14, and a fan module 16. The electronic circuit fan assembly 10 is part of a larger electronic system, such as a computer system.

Each circuit module 14 comprises a circuit module base board 18, an array (indicated by the vertical and horizontal double lines 22) of modular integrated circuits 20, and circuit module mounting means 24 for mounting the circuit module 14 on the side wall 26 of the housing 12. The modular integrated circuits 20 are mounted in rows on the base board 18. The side wall 26 functions as a receiving means for receivably mounting circuit modules 14 and fan modules 16 on the housing 12.

The fan module 16 comprises a fan module mounting structure including a base board 28. The fan module 16 further comprises a fan unit 30, fan power wires 32, a driving circuit 34, a light-indicator circuit 36, and fan module mounting means 38 for mounting the fan module 16 on the side wall 26. The fan module mounting means 38 is mounted to the base board 28 by mounting bolts 42. The circuit module mounting means 24 and the fan module mounting means 38 are of identical construction so the circuit modules and fan modules are interchangeable. However, the fan module 16 and the circuit modules 14 can have mounting means of different construction, as long as the fan module fits into the same space and mounts to the same receiving means as the circuit modules 14.

The fan unit 30 is mounted to the fan module base board 28 by fan bolts 40. Therefore, the fan unit 30 is easily removed from the base board 28. In some embodiments of the invention, the mounting structure for the fan unit 30 is not a base board 28. For example, the mounting structure can be a frame with fan module mounting means 38 for mounting the frame to the housing 12. Also, a fan housing can be provided around the fan unit 30 to prevent interference with electronic signals to or from the electronic system.

The base board 28 of the fan module 16 can have modular integrated circuits mounted on the portion of the base board 28 which does not have the fan unit 30. In addition to modular integrated circuits, other electronic components, such as components for telephone communication equipment can be included.

The fan module 28 is electrically connected to the power source of the electronic system by the board connector 60. The board connector 60 inserts into the receiving connectors 61 attached to the housing 12. In some electronic systems, the board connector 60 serves as the fan module mounting means for mounting the base board 28 to the housing 12 because brackets 44, 46, and 48 are not included. The receiving connectors 61 function as electrical connections between the board connectors 60 of the modules 14 and 28 and the electronic system. The receiving connectors 61 can also serve as the mechanical receiving means for receivably mounting the circuit modules 14 and the fan module 28 on the housing 12.

The mounting means 38 comprises upper and lower board brackets 44 and 46, respectively, and L-bracket 48. The upper and lower board brackets 44 are attached to the L-bracket 48 by conventional means, such as rivets or welding. Alternatively, the upper and lower board brackets 44 and 46 can be adapted to fit into slots within the L-bracket 48 for easy installation and removal. The L-bracket 48 is connected to the receiving means by a housing bolt 50. The fan power wires 32 are connected to the board traces 55 by conventional electrical connectors.

The fan module 16, and in particular the driving circuit 34, receives its power from the power source of the electronic system. The driving circuit 34 has a time delay means for ensuring that the fan units will not be powered on at the same time as the other component parts of the electronic system, such as the circuit modules 14. When the electronic system is powered on, many component parts of the electronic system draw current from the system power supply. The time delay means causes the fans to power up after the initial power surge in the electronic system is over. For many electronic systems a time delay of approximately one to two seconds is sufficient.

FIGS. 1 and 2 show only one fan unit 30 mounted on a first planar surface 54 of the fan module base board 28. However, a second fan unit could be mounted in the sector 56 on the first planar surface 54. Also, additional fan units could be mounted on the second planar surface 58 of the base board 28 opposite the first planar surface 54. The fan units can be mounted at selected positions along the planar surface of the base board 28. Finally, as is illustrated in FIG. 4, it is possible to construct the fan module 16 so that the fan unit 30 can be removed and replaced with a panel 92 having modular integrated circuitry, as on the circuit modules 14.

The fan unit 30 has a height and width to fit on the base board 28 without protruding beyond the edges of the base board 28. The depth or thickness of the fan unit 30 is such that space is left between the fan module 16 and the circuit modules 14 so cooling air can flow easily. The fan unit 30 is usually on the planar surface of the base board 28 opposite to the circuit module to be cooled.

The time delay portion of the driving circuit 34 is illustrated in FIG. 2. The dotted lines represent electrical traces 55 in the base board 28. The time delay portion of the driving circuit 34 includes an input 62 from a 12 V power source of the electronic system, a 1 K ohm resistor 64, a base capacitor 66, an emitter capacitor 68, and a transistor 70. The 12 V input 62, the 1 K ohm resistor 64, and the base capacitor 66 are electrically connected in series to ground 72. The input terminal of the resistor 64 is connected to the collector of the transistor 70 and the output terminal of the resistor 64 is connected to the base of the transistor 70. The emitter of the transistor 70 is connected to the emitter capacitor 68. Both the emitter capacitor 68 and the base capacitor 66 can be 220 $\mu f$. The emitter capacitor 68 is connected to ground and thus can function as a noise filter to filter transients from the power source of the electronic system.

A mechanical switch 74 is provided so the fan unit 30 can be manually switched to the on and off states. If a fan unit is provided in sector 56, a similar mechanical switch can be provided.

The light-indicator circuit 36 comprises a 5 V input 76 from the electronic system, a 220 ohm resistor 78, and an indicator light 80, all in series. The indicator light 80 is connected to ground 72. Other light-indicator circuits well known to those skilled in the art can be provided.

The air flow created by the fan unit 30 during operation is initially directly through an opening behind the fan unit 30 and against the adjacent circuit module 14 along the arrow 82. The air then tends to be directed along the surface of the circuit module 14 away from the area of the fan unit 30. A switch can be provided on the fan unit 30 so the direction of the air flow can be changed by changing the rotational direction of the fan blades. In some embodiments of the invention, channels can be provided between the circuit modules 14 and the housing 12 so that air can more easily flow throughout the housing 12. Finally, air vents can be provided in the housing 12 to take in cool air and let out heated air.

Turning to FIG. 3, another embodiment of fan module 83 is illustrated wherein the fan unit 30 is slidable on a set of racks 84 and 86. The fan unit is attached to the racks 84 and 86 by slidable connectors 88. The slidable connectors 88 are attached to the fan unit 30 by connector bolts 90. The slidable connectors 88 slide along the racks 84 and 86 so that the fan unit 30 can be positioned at various locations along the opening 89 to cool circuitry at selected locations on an adjacent circuit module. The driving circuitry is the same as that of FIG. 2 and can be electrically connected to the fan unit by fan wires 91 or by other suitable means well known to those skilled in the art.

FIG. 4 illustrates a fan module 93 on which the fan unit is removed and replaced with a modular integrated circuit panel 92. The circuit panel 92 is electrically connected to the electronic system through the fabric connector 94. In this way, the individual modular integrated circuits 96 can function in the same way within the electronic system as they do on a circuit module. The fan module 93 on which a panel 92 can be mounted is advantageous in that the module can selectively function as a cooling unit or mounting structure for circuitry. The driving circuit 34 on the fan module 93 can be the same as that on the fan module 16 of FIG. 2. The driving circuit 34 is electrically connected when the circuit panel 92 is replaced by a fan unit 30.

The electronic circuit module fan assembly of the present invention has many advantages. The fan module of the present invention can be located directly adjacent to the circuit module to be cooled. The present invention provides more direct air turbulence for cooling of the circuitry than prior cooling systems. The cool air from the fan unit of the present invention displaces the warming air in closest proximity to the circuit module. Thereby preventing the circuit module from getting hot. In prior cooling systems, the fans are typically located remotely from at least some of the circuit modules in the electronic system. The proximity of the fan to the circuit modules can also serve to prevent dust or other particles from accumulating on the circuit modules or their circuitry.

The electronic circuit module fan assembly of the present invention also provides a more compact cooling system because a separate compartment for the fan apparatus is not required. Prior cooling systems typically locate the fan within a separate cabinet in the housing, resulting in more complicated and expensive manufacture of the electronic system and the usage of limited space in the electronic system. An additional advantage of the present invention is that the number of fans used in the cooling system can be varied without major alterations in the electronic system. The fan modules can be removed or added according to the needs of the user of the electronic system. If fan modules are removed, there is more room for additional circuit modules to be installed.

The present invention further provides for ease of removal of the fan modules for maintenance and replacement. One of the advantages of electronic systems having circuit modules is ease of maintenance and replacement of the circuit modules. The present invention takes advantage of this modular construction in relation to the cooling system. A further advantage of the present invention is that it can be easily adapted to draw current from the power source of the electronic system. Moreover, the close proximity of the fan units of the present invention to the circuit modules allows for the employment of fans which draw less power. In prior cooling systems, the remoteness of the fans from the circuit modules often requires fans with high capacity air flows. The proximity of the fans to the circuit modules being cooled also allows for fans with a more compact size and lower cost and complexity.

Finally, the present invention substantially reduces the need for bulky and elaborate heat sinks in thermal connection with the circuitry on the circuit modules. The reason for this is that the air turbulence provided by the fans of the present invention more directly cools the circuit modules.

Although various embodiments of the present invention have been described in considerable detail, other versions and embodiments of the invention are possible. Therefore, the present invention is not limited to the embodiments described herein, but instead is defined by the spirit and scope of the appended claims.

What is claimed is:

1. A fan module for cooling a circuit module in an electronic system,
   wherein the circuit module includes:
   (i) a circuit module base board;
   (ii) circuitry mounted to the circuit module base board; and
   (iii) a circuit module board connector integral with the circuit module base board;
   and wherein the electronic system includes an electrical circuit and a plurality of receiving connectors each for receiving the circuit board connector to electrically connect the circuitry to the electrical circuit in the electronic system and to mechanically connect the circuit module base board within the electronic system;
   the fan module comprising:
   (a) a fan module base board having first and second planar surfaces and first and second edges;
   (b) an electrical fan unit mounted to the first planar surface of the fan module base board for cooling the circuitry mounted to the circuit module base board;
   (c) a driving circuit electrically connected to the fan unit for activating the fan unit when the fan module is mounted to the electronic system and the electronic system is powered on; and
   (d) a fan module base board connector integral with the fan module base board adjacent the first edge for mechanically mounting the fan module base board to each of the receiving connectors interchangeably with the circuit module base board and for electrically connecting the driving circuit to the electrical circuit through one of the receiving connectors, the fan unit having a depth such that the fan unit is spaced apart from the circuitry on the circuit module when the circuit module and the fan module are mounted to different ones of the receiving connectors.

2. The fan module of claim 1 wherein (1) the electronic system further includes a housing, (2) the circuit module further includes a circuit module bracket assembly attached to the circuit module base board and attachable to the housing, and (3) the fan module further includes a fan module bracket assembly attached to the second edge of the fan module base board and attachable to the housing interchangeably with the circuit module bracket assembly.

3. The fan module of claim 1 wherein the fan module base board has an opening behind the fan unit through which an air flow is directed when the fan unit is operating.

4. The fan module of claim 1 wherein the driving circuit has a noise filter for filtering power transients on the driving circuit.

5. The fan module of claim 1 further including a light-indicator device for indicating that power for the electronic system is on.

6. The fan module of claim 1 wherein the fan unit is selectively mountable on the first and second planar surfaces of the fan module base board.

7. A fan module for cooling a circuit module in an electronic system,
wherein the circuit module includes:
(i) a circuit module base board;
(ii) circuitry mounted to the circuit module base board;
(iii) a circuit module board connector integral with the circuit module base board; and
(iv) a circuit module bracket assembly attached to the circuit module base board and attachable to a housing of the electronic system;
and wherein the electronic system includes the housing, an electrical circuit, and a plurality of receiving connectors each for receiving the circuit board connector to electrically connect the circuitry to the electrically circuit in the electronic system and to mechanically connect the circuit module base board within the electronic system;
the fan module comprising:
(a) a fan module base board having first and second planar surfaces and first and second edges;
(b) an electrical fan unit mounted to the first planar surface of the fan module base board for cooling the circuitry mounted to the circuit module base board;
(c) a driving circuit electrically connected to the fan unit for activating the fan unit when the fan module is mounted to the electronic system and the electronic system is powered on;
(d) a fan module base board connector integral with the fan module base board adjacent the first edge for mechanically mounting the fan module base board to each of the receiving connectors interchangeably with the circuit module base board and for electrically connecting the driving circuit to the electrical circuit through one of the receiving connectors; and
(e) a fan module bracket assembly attached to the second edge of the fan module base board and attachable to the housing, the fan unit having a depth such that the fan unit is spaced apart from the circuitry on the circuit module when the circuit module and the fan module are mounted to different ones of the receiving connectors.

8. The fan module of claim 7 wherein the fan module base board has an opening behind the fan unit through which an air flow is directed when the fan unit is operating.

9. The fan module of claim 7 further including a light-indicator device for indicating the power for the electronic system is on.

10. The fan module of claim 7 wherein the receiving connectors comprise substantially parallel slots in spaced apart relation to one another and wherein the circuit module board connector and the fan module board connector each comprise a protruding portion of the respective base boards, each protruding portion being capable of fitting snugly in any one of the slots.

11. An electronic system comprising:
(a) a circuit module including:
(i) a circuit module base board;
(ii) circuitry mounted to the circuit module base board; and
(iii) a circuit module board connector integral with the circuit module base board;
(b) a plurality of receiving connectors each for receiving the circuit board connector to electrically connect the circuitry to an electrical circuit in the electronic system and to mechanically connect the circuit module base board within the electronic system;
(c) a fan module comprising:
(i) a fan module base board having first and second planar surfaces and first and second edges;
(ii) an electrical fan unit mounted to the first planar surface of the fan module base board for cooling the circuitry mounted to the circuit module base board;
(iii) a driving circuit electrically connected to the fan unit for activating the fan unit when the fan module is mounted to the electronic system and the electronic system is powered on; and
(iv) a fan module base board connector integral with the fan module base board adjacent the first edge for mechanically mounting the fan module base board to each of the receiving connectors interchangeably with the circuit module base board and for electrically connecting the driving circuit to the electrical circuit in the electronic system through one of the receiving connectors,
the fan unit having a depth such that the fan unit is spaced apart from the circuitry on the circuit module when the circuit module and the fan module are mounted to different ones of the receiving connectors.

12. The electronic system of claim 11 further including a housing and wherein (1) the circuit module further includes a circuit module bracket assembly attached to the circuit module and detachably attached to the housing, and (2) the fan module further includes a fan module bracket assembly attached to the second edge of the fan module base board and detachably attached to the housing interchangeably with the circuit module bracket assembly.

13. The electronic system of claim 11 wherein the driving circuit has a noise filter for filtering power transients on the driving circuit.

14. The electronic system of claim 11 wherein the fan unit is selectively mountable on the first and second planar surfaces of the fan module base board.

15. The fan module of claim 1 further including means for reducing an initial power surge of the electronic system.

16. The fan module of claim 7 further including means for reducing an initial power surge of the electronic system.

17. The fan module of claim 7 wherein the fan module includes a plurality of fan units.

18. The fan module of claim 2 wherein the circuit module and fan module bracket assemblies each comprise (1) upper and lower board brackets attached to the circuit module and fan module base boards, and (2) an L-bracket attached to the upper and lower board brackets and attachable to the housing.

19. The fan module of claim 7 wherein the circuit module and fan module bracket assemblies each comprise (1) upper and lower board brackets attached to the circuit module and fan module base boards, and (2) an L-bracket attached to the upper and lower board brackets and attachable to the housing.

20. The electronic system of claim 12 wherein the circuit module and fan module bracket assemblies each comprise (1) upper and lower board brackets attached to the circuit module and fan module base boards, and (2) an L-bracket attached to the upper and lower board brackets and detachably attached to the housing.

* * * * *